United States Patent [19]
Papadopoulos

[11] Patent Number: 5,808,349
[45] Date of Patent: Sep. 15, 1998

[54] MAGNETIZED PHOTOCONDUCTIVE SEMICONDUCTOR SWITCH

[75] Inventor: Konstantinos Papadopoulos, Chevy Chase, Md.

[73] Assignee: APTI Inc., Washington, D.C.

[21] Appl. No.: 567,725

[22] Filed: Dec. 5, 1995

Related U.S. Application Data

[63] Continuation of Ser. No. 202,576, Feb. 28, 1994, abandoned.

[51] Int. Cl.$^6$ ............................. H01L 29/82; H01L 43/00
[52] U.S. Cl. ..................... 257/421; 257/422; 257/425; 257/430; 257/431
[58] Field of Search .................................. 257/421, 425, 257/422, 430, 431

[56] References Cited

U.S. PATENT DOCUMENTS

| | | | |
|---|---|---|---|
| 2,938,160 | 5/1960 | Steele | 257/422 X |
| 2,943,269 | 6/1960 | Huang | 257/422 X |
| 3,408,499 | 10/1968 | Weiss | 257/421 X |
| 3,409,847 | 11/1968 | Nanney | 257/422 |
| 3,731,214 | 5/1973 | Bers | 330/5.5 |
| 4,339,715 | 7/1982 | Bloodworth et al. | 324/252 |
| 4,450,460 | 5/1984 | Morimoto | 357/17 |
| 4,806,885 | 2/1989 | Morimoto | 332/7.51 |
| 5,210,403 | 5/1993 | Nakamura et al. | 250/214.1 |

FOREIGN PATENT DOCUMENTS

| | | | |
|---|---|---|---|
| 1101099 | 3/1985 | U.S.S.R. | 257/422 |
| 0990031 | 9/1987 | U.S.S.R. | 257/421 |
| 2101404 | 1/1983 | United Kingdom | 257/421 |

OTHER PUBLICATIONS

Grove, *Physics and Technology of Semiconductor Devices*, John Wiley & Sons, Inc. New York, 1967, pp. 37–110.

Steele, "Magnetic Tuning of Gunn Effect Oscillators", RCA Technical Notes, No. 663, Nov. 1965, pp. 1–2.

*Primary Examiner*—William Mintel
*Attorney, Agent, or Firm*—Rossi & Associates

[57] ABSTRACT

A strong magnetic field is applied to a photoconductive semiconductor switch to make the opening time of the switch independent of the recombination time of the photoionized semiconductor. As a result, the switch is capable of shaping current pulses with the fidelity of an illuminating optical pulse used to activate the switch. The strong magnetic field applied to the photoconductive semiconductor switch has a strength satisfying the relationship $\mu B > 1$, where $\mu$ is the mobility of the semiconductor (in m$^2$/Volt Sec) and B the magnetic field (in Tesla). Such a switch acts as an insulator (magnetic insulation) to an applied electric field except during the time that the light incident thereon generates electron-hole pairs. During that time, a polarization current, proportional to the externally induced pair production rate, flows and the magnetic insulation is broken. The minimal system response time is controlled by the gyrofrequency of the carriers. The response time is shorter than one picosecond for materials with small carrier effective mass and magnetic fields of one Tesla.

6 Claims, 6 Drawing Sheets

MAGNETIZED PHOTOCONDUCTIVE SEMICONDUCTOR SWITCH

This is a Continuation of application Ser. No. 08/202,576 filed Feb. 28, 1994, now abandoned.

FIELD OF THE INVENTION

The invention relates in general to photoconductive semiconductor switches. More specifically, the invention provides a magnetized photoconductive semiconductor switch having improved switching characteristics.

BACKGROUND OF THE INVENTION

A semiconductor switch can best be described as two terminals or contacts separated by a material medium. The medium acts as an electrical insulator in an "open" or "off" state, and also acts as an electrical conductor in a "closed" or "on" state. The response time of a switch is the time required to switch from an insulating "off" state to a conducting "on" state and back to the insulating "off" state. The response time therefore controls the minimal duration of a current or voltage pulse generated by the switch.

Optically activated photoconductive semiconductor switches (PCSS's) have excellent switching properties. The PCSS's are basically bulk semiconductor devices with high intrinsic resistance. PCSS's therefore provide a large resistance and act as good insulators when placed between two electrodes. The transition of the PCSS's from an insulating state to a conducting state is accomplished by using optical energy to produce electron-hole pairs, while the return to the insulating state following the end of the optical pulse is due to loss of the carriers by recombination or sweep-out.

Picosecond photoconductors have many applications due to their unique characteristics which include high speed, large dynamic range, scalability, and a response free of jitter. A basic function of the PCSS's is electronic switching and gating. Other applications include generation of microwave bursts, microwave modulation, waveform generation, active pulse shaping, sampling, and optical and particle detection. The two most important characteristics of the PCSS's for the above applications are the device speed and the switching efficiency, as speed is the most desirable characteristic in low voltage applications and switching efficiency (in addition to high speed) is most critical in high voltage applications.

Photon absorption by a semiconductor followed by the formation of an electron-hole pair is intrinsically a very fast process. It is only limited by the uncertainty principle and the requirement that the frequency spectrum of the optical pulse fall within the absorption bands of electronic transitions from bound to free states. Since the width of these bands is of the order of one electron volt (eV) the pair formation time can in principle be as short as $10^{-15}$ seconds. As a result the rise time of the current can be extremely fast.

Although the onset of photoconduction is extremely rapid, several effects influence the subsequent evolution of the current, resulting in response times longer than tens or hundreds of picoseconds. The most important problem for application to picosecond devices is recombination. Recombination is an intrinsically slow process and follows the establishment of quasi-equilibrium of the plasma with the lattice. It results in a highly undesirable long-lasting current waveform which inhibits formation of short pulses desirable in many applications.

Efforts to fabricate materials with short recombination times are continuing. Subpicosecond pulses, however, have still been elusive. Furthermore, the techniques used to reduce the recombination time are often accompanied by an undesirable increase in the dissipation rate. Other techniques such as carrier sweep out in reverse-biased junctions have also been applied to speed up the termination of the current. However, its use is limited by the fact that carrier speeds saturate at high fields to velocities of the order of $10^7$ cm/s. Furthermore, the photovoltaic behavior of p-n junctions and the need for large reverse bias makes them unsuitable for most picosecond applications.

In view of the above, it is an object of the present invention to provide a photoconductive semiconductor switch with improved switching characteristics that is capable of generating subpicosecond pulses.

SUMMARY OF THE INVENTION

The invention utilizes the application of a strong magnetic field to a photoconductive semiconductor switch to make the opening time of the switch independent of the recombination time of the photoionized semiconductor. As a result, the switch is capable of shaping current pulses with the fidelity of an illuminating optical pulse used to activate the switch. The strong magnetic field applied to the photoconductive semiconductor switch has a strength satisfying the relationship $\mu B>1$, where $\mu$ is the mobility of the semiconductor (in $m^2$/Volt Sec) and B the magnetic field (in Tesla). Such a switch acts as an insulator (magnetic insulation) to an applied electric field except during the time that the light incident thereon generates electron-hole pairs. During that time, a polarization current, proportional to the externally induced pair production rate, flows and the magnetic insulation is broken. The minimal system response time is controlled by the gyrofrequency of the carriers. The response time is shorter than one picosecond for materials with small carrier effective mass and magnetic fields of one Tesla.

BRIEF DESCRIPTION OF THE DRAWINGS

The invention will be described in greater detail with reference to the accompanying drawings, wherein.

DETAILED DESCRIPTION OF THE PREFERRED EMBODIMENTS

The present invention is based on the application of a magnetic field to a photoconductive semiconductor switch. The application of a magnetic field to a PCSS has been utilized in the past. For example, a variation of the sweep out mode has previously been proposed, as described in "Magnetic Field Effects in a Photoconductive Switch", by Parikh and Lindholm, Journal of Applied Physics, 64(11), December 1988, the contents of which are herein incorporated by reference, in which the insertion of a switch in a static magnetic field perpendicular to the applied voltage has been shown to reduce the recombination time. The reason for the reduction is that, in the presence of the combined action of the crossed electric and magnetic fields, the optically generated electron-hole plasma drifts towards a surface which can be fabricated to have a high recombination rate. In the above technique, it is required that the value of the magnetic field be relatively weak in the sense of $\mu B$ being much less than 1.

While the present invention also relies on the presence of a static magnetic field perpendicular to the applied voltage, two important differences set the present invention apart from the prior art: first, the present invention utilizes a strong magnetic field so that $\mu B>1$; and secondly, the present invention does not rely on the presence of a fast recombining surface, but instead, on the concept of magnetic insulation. As a result, both the switch parameters and the procedure for controlling the "on" and "off" states of the switch are radically different, as will be described in greater detail below.

The invention relies on two fundamental physical concepts arising from the behavior of plasma carriers in crossed electric and magnetic fields. The concept of magnetic insulation and the concept of the polarization current. Both concepts have been theoretically developed and experimentally verified for gaseous plasmas. The concept of magnetic insulation in particular has also been implemented in gaseous plasma switches. In transferring and applying these concepts from gaseous to semiconductor plasmas some modifications are required. These modifications are due to the fact that in a semiconductor plasma the positive and negative carriers have comparable "effective" masses, which are a fraction of the classical electron mass. As a result, the response time of semiconductor carriers to the action of a magnetic field is several (10–20) times faster for the negative carriers (electrons) and $10^{4-10}5$ faster for the positive carriers than in gaseous plasmas. Notice also that contrary to the gaseous plasmas in semiconductor plasmas the response timescales of the positive (holes) and negative (electron) carriers are comparable.

Figure 1:
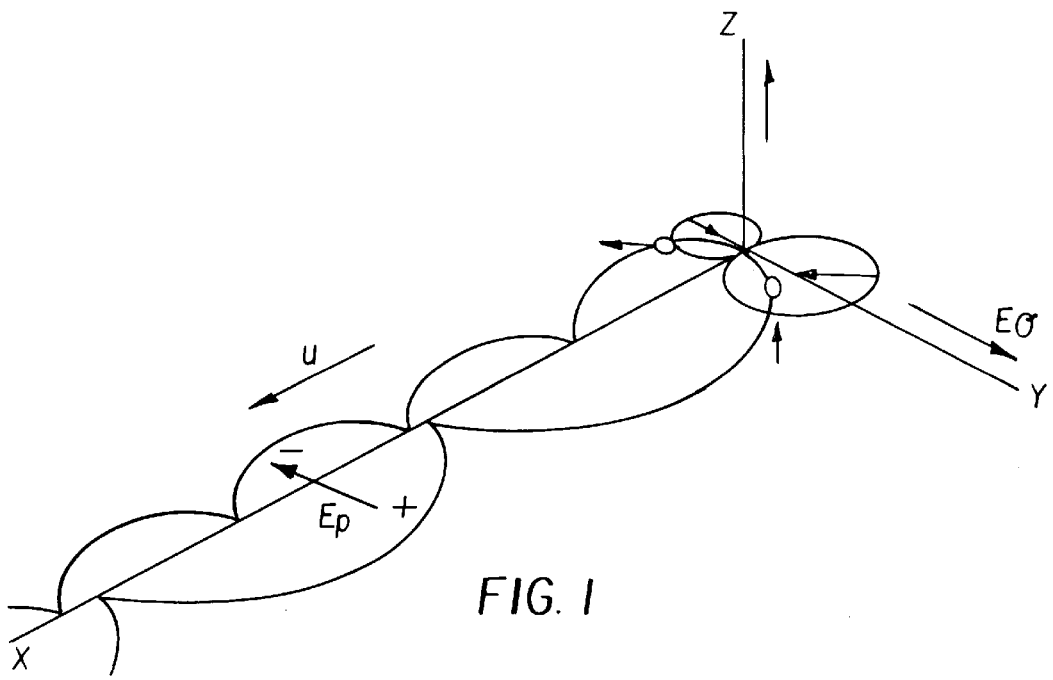
FIG. 1 illustrates the orbits of electrons and holes in a semiconductor caused by crossed electric and magnetic fields.

FIG. 1 illustrates the orbits of electrons and holes in a semiconductor caused by crossed electric and magnetic fields, in the absence of collisions, and for times longer than one gyrotime $1/\Omega$, wherein $\Omega$ is the gyrofrequency of the electrons and holes defined by the equation:

$$\Omega = 1.8 \times 10^{11} B \ (m/m^*) \quad \text{EQ. (1)}$$

Figure 2:
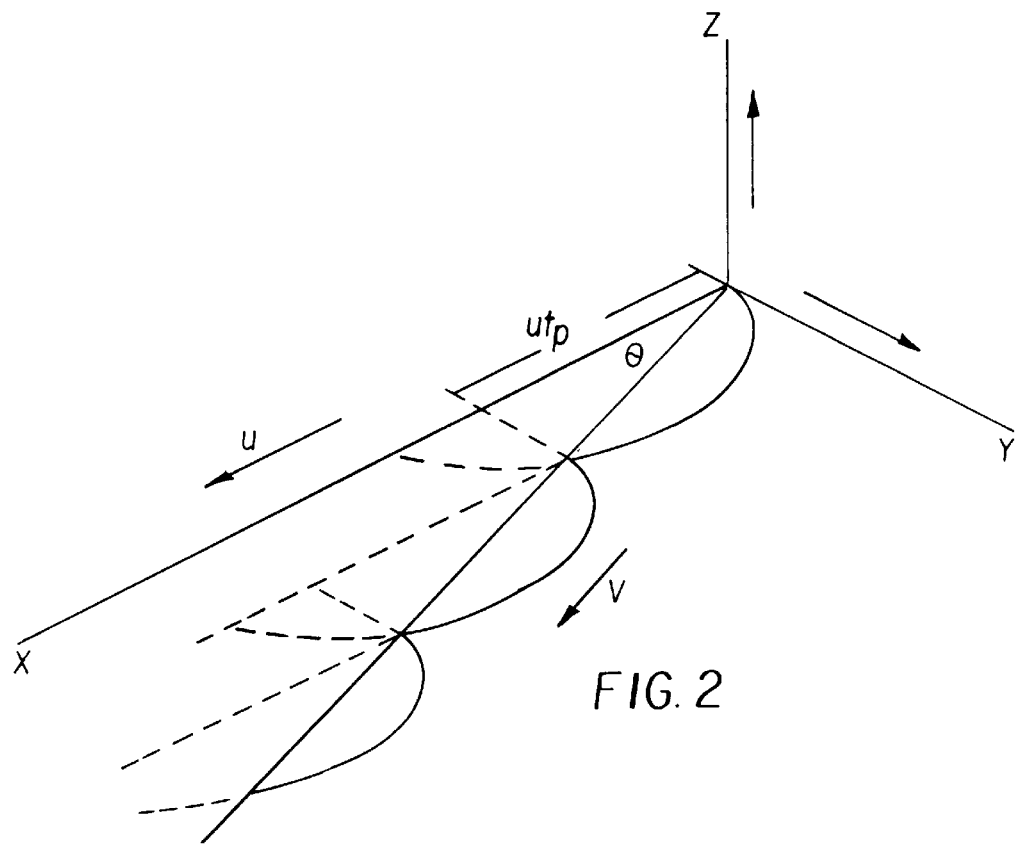
FIG. 2 illustrates a component in the direction of the electric field.

In Eq. (1), B is the magnetic field in Tesla, and m,m* are the classical electron mass and the effective mass of the relevant carrier respectively. The orbits in FIG. 1 illustrate the concept of magnetic insulation. Both electrons and holes drift transverse to the magnetic field with the same speed. As a result there is no current in the x-direction nor in the y-direction. The last feature is different in semiconductor plasmas than in regular gas plasmas, since in gas plasmas there is an electron Hall current that lasts for a time equal to the ion to the electron mass ratio times the electron gyrotime. When collisions are taken into account the motion of the carriers in crossed electric and magnetic fields acquires a component in the direction of the electric field (See FIG. 2). The angle between the direction of the drift and that of the electric field is $\pi/2-\Theta$ with the angle $\Theta$ determined by the equation:

$$\text{tg}\Theta = \mu B \quad \text{EQ. (2)}$$

For $\mu B >> 1$ the angle q is very small and the magnetized plasma acts as an insulator. The current in the x-direction will be given by the equation:

$$J_x = 2n \ (e^2/m^*\tau)[1/1+(\mu B)^2]E = J_{xo}[1/(1+(\mu B)^2)] \quad \text{EQ. (3)}$$

In Eq. (3), e is the electron charge, $\Theta$ is the carrier collision frequency and E the electric field; $J_{xo}$ is the current induced by the field E in the absence of a magnetic field. The reduction of this current by the factor $[1/(1+(\mu B)^2)]$ represents the effect of the magnetic insulation.

The concept of the polarization current can be understood by following the temporal evolution of a photoinduced electron-hole pair in the presence of crossed eclectic and magnetic fields (FIG. 1). For a time $t<1/\Omega$ the pair is accelerated along the electric field in opposite directions. For longer times it simply drifts in the y-direction. As a result a polarization field P is build whose value is given by the equation:

$$P = ne(2 \ Dx) \quad \text{EQ.(4a)}$$

$$Dx = (\tfrac{1}{2})(eE/m^*\Omega^2) \quad \text{EQ.(4b)}$$

The build-up of the polarization field is associated with a polarization current $J_{px}$ given by the equation:

$$J_{px} = [(dn/dt)/\Omega](e^2/m^*n)(1/\mu B)E = J_{xo}[(dn/dt)/n\Omega](1/\mu B) \quad \text{EQ.(5)}$$

where (dn/dt) is the production rate of electron-hole pairs. As seen from Eq. (5), a large current can flow in the x-direction during production (i.e. (dn/dt)>0) despite the large magnetic field, thereby breaking the magnetic insulation. The current is proportional to the production rate.

The operational principle of the switch can be understood by combining Eqs. (3) and (5) for the total current J in the x-direction as a function of time as:

$$J(t) = [J_{xo}/1+(mB)^2][(\mu B)N(t)+1] \quad \text{EQ.(6a)}$$

$$N(t) = (dn/dt)/n\Omega \quad \text{EQ.(6b)}$$

In writing Eqs. (6a) and (6b), it is assumed that $\mu B >> 1$ and it is clear that during the illumination time of the photoconductor the current will be larger by a factor $(\mu B)N(t)$ than the current following the switching of the illumination. For example, if $(\mu B)=10$ and N=30 the current will be reduced by a factor of 300 within a time of the order of $1/\Omega$. An additional advantage of such a switch is its low dissipation rate since the ohmic heating is related only to the small current $J_x$. The dissipation rate would be by a factor $(\mu B)^2$ smaller than in the absence of a magnetic field.

Figure 3:
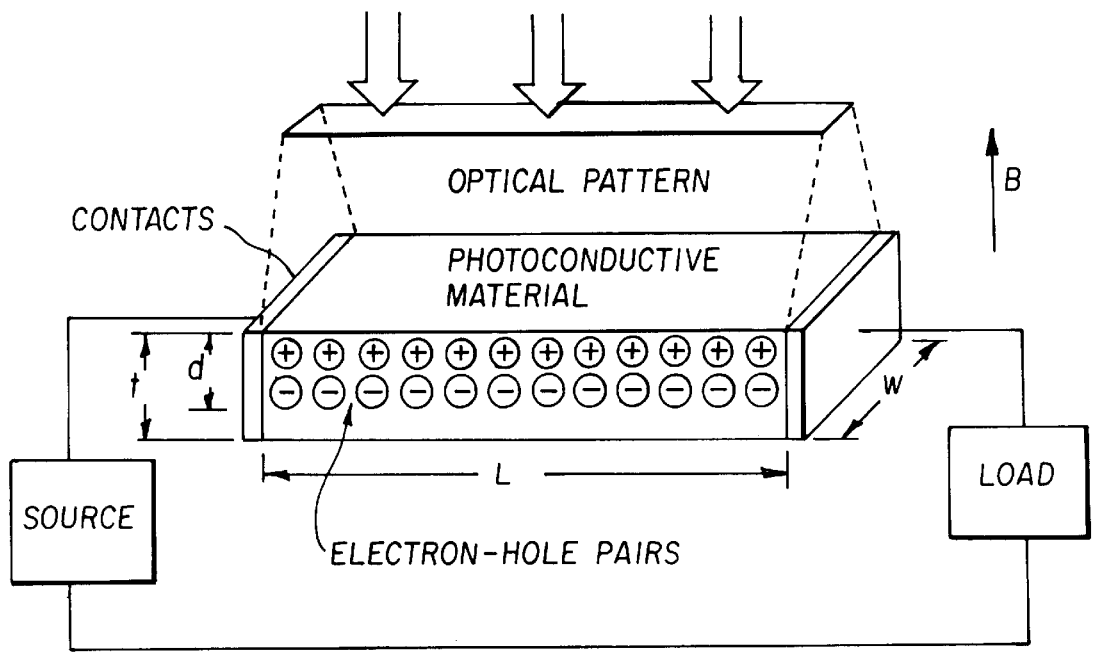
FIG. 3 is a schematic block diagram of a magnetic photoconductive semiconductor switch in accordance with the invention.

A photoconductive switch in accordance with the invention is illustrated in FIG. 3. The switch 10 includes a block of semiconducting material 12 with dimensions of length thickness and width respectively defined as l, t and w. Contacts 14 are provided on each end of the semiconducting material 12 to provide connection to a power source and load. Permanent magnets 16 are used to apply a magnetic field to the semiconducting material. The length of the switch 10 is determined by the dielectric strength of the semiconductor surface given by $1/V < E_m$, where V is the applied voltage and $E_m$ is the breakdown surface electric field. Experimental results indicate surface electric fields up to 90 kV/cm for Silicon and 140 kV/cm for Gallium Arsenide (GaAs).

The semiconducting material 12 is changed from an insulating state into a conducting state by illuminating the face of the switch 10 with a uniform optical intensity between the contacts 14. The factors controlling the properties of the illuminating source are similar for magnetized and unmagnetized semiconductors and have been analyzed. See "High-Power Microwave Generation Using Optically Activated Semiconductor Switches", by Nannully, IEEE Transactions on Electron Devices, Vol. 37, No. 12, December 1990, the contents of which are herein incorporated by reference. The illuminating wavelength must be such that the photon energy must be close to the semiconductor bandgap energy. For Silicon, the wavelength must be less than 1.09 mm corresponding to a bandgap energy 1.14 eV and for GaAs, the wavelength must be less than 0.89 mm corresponding to a bandgap energy 1.39 eV. Another design factor is the optical absorption length which determines the required thickness d of the switch. The optical absorption length of Silicon at a wavelength of 1.06 mm is approximately 1 mm, while that of GaAs near 0.89 mm, is less than 10 mm. Above the band edge, intrinsic GaAs becomes essentially transparent with absorption length of up to several centimeters, while the absorption length of extrinsic GaAs (GaAs with a donor impurity concentration), can be several millimeters.

Figure 4:
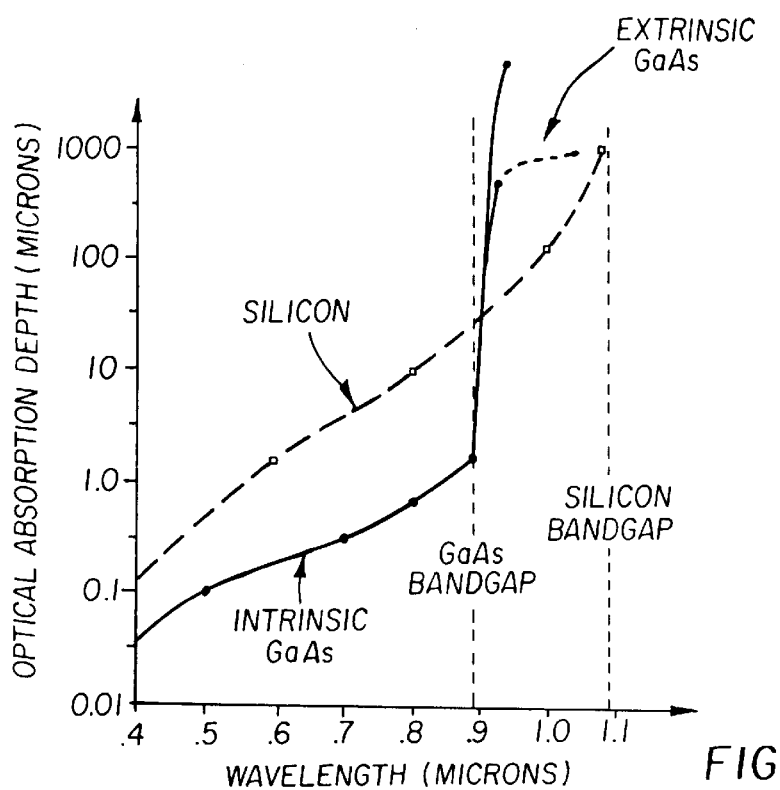
FIG. 4 is a graph illustrating the semiconductor optical absorption depth versus wavelength for silicon and GaAs.

The switching efficiency is optimized when the wavelength is chosen so that the absorption length equals to the electrical skin depth, thereby insuring participation of the majority of the carriers in the current flow. Optimum thickness should be about 4–5 absorption lengths, while the absorption length should be equal to the electrical skin depth. FIG. 4, taken from Nunnally cited above, gives the semiconductor optical absorption depth versus wavelength for Silicon and GaAs.

The maximum practical carrier density in Silicon is approximately $5 \times 10^{17}$ cm$^{-3}$ limited by thermal runaway. The carrier density and drift velocity limit for conduction fields of the order of 4 kV/cm give a maximum current density of the order of 50 kA/cm$^2$ for Silicon. Similar considerations for GaAs give maximum current density of the order of 400 kA/cm$^2$. Using the optical absorption length $d_o$ given by FIG. 4, the upper limit of current per unit width of the switch face will be:

$$I_m = J_m \cdot d_o [A/m]$$

As a result, 5 kA/cm is expected for Silicon and 0.4 kA/cm is expected for GaAs. The minimum switch width or the minimum cross-section vary with the requirements of the particular applications, which is also true for considerations concerning the removal of heat from the switch volume.

The performance of a magnetic photoconductive semiconductor switch (MSS) in accordance with the invention can be described by the following set of equations:

$$J(t) = [(1+f) a \, n(t) E]/b^2 + [a(Q(t)/\Omega)E]/b \qquad \text{EQ.(7a)}$$

$$dn/dt = Q(t) - (n/\tau) \qquad \text{EQ.(7b)}$$

where:

$$a = e^2/m^*_v = e\mu; \text{ and } b = mB \qquad \text{EQ.(8a)}$$

$$Q(t) = P_L(t)(1-r)/K \, E\lambda \qquad \text{EQ.(8b)}$$

In Eqs (7a–8b) τ is the carrier loss time (recombination or sweep-out), f the ratio of the hole to electron mobility, $P_L(t)$ is the time varying optical power in watts, r is the material reflectivity at the light wavelength, K is the semiconductor volume irradiated by light, and $E_\lambda$ is the photon energy in Joules. The first term in Eq. (7b) describes the pair production rate, while the last term the attrition rate. The response of an unmagnetized switch is also described by the above equations if one ignores the second term in Eq. (7a) and takes b=1. The value of E is the value inside the semiconductor and is taken as a slowly varying function of time.

The solution to equation (7b) is given by:

$$n(t) = \exp(-t/\tau) \, \partial^t \exp(-t/\tau) Q(t) dt \qquad \text{EQ.(9)}$$

Assuming that the light power is constant at $P_o$ for a period $t_o$, the carrier density becomes:

$$n(t) = [P_o \tau (1-r)/K \, E\lambda][1 - \exp(-t/\tau)] \qquad \text{EQ.(10)}$$

for times $0 < t < t_o$. If the illumination is terminated at $t_o$ the carrier density will decay as:

$$n(t) = n(t=t_o) \exp(-t/\tau) \qquad \text{EQ.(11)}$$

Eqs. (7–11) describe the temporal behavior of the current in the switch. From equations (7–11) the temporal behavior of the switch conductance G(t) can be written as:

$$G(t) = a \, (K/l^2) \{[n(t)(1+f)/b^2] + Q(t)/\Omega b\} \qquad \text{EQ.(12)}$$

The temporal dependance of the conductance is reflected in F(t). Using Eqs. (10) and (11) which are valid for a square laser pulse:

$$G(t) = (a/l^2)[P_o(1-r)/\Omega E\lambda b] F(t) \qquad \text{EQ.(13a)}$$

$$F(t) = S(t-t_o)[1 + (1+f)(\Omega \tau/b)[1 - \exp(-t/\tau)] + S(t_o-t)(1+f)(\Omega t_o/b)[1 - \exp(-t_o/\tau)] \exp[-(t-t_o)/\tau] \qquad \text{EQ. (13a)}$$

S(x) is the step function defined as 1 for x<0 and zero otherwise. For a total energy in the light pulse given by:

$$E_L = P_o t_o \qquad \text{EQ.(14)}$$

the conductance is given by:

$$G(t) = (a/l^2)[E_L(1-r)/(\Omega t_o) E_\lambda b] F(t) \qquad \text{EQ.(15)}$$

and the resistance is given by:

$$R(t) = (l^2/a)[(\Omega t_o) E_\lambda b/E_L(1-r)][1/F(t)] \qquad \text{EQ.(16)}$$

In Eqs. (15) and (16) the factor F(t) describes the switching action of the MSS while the rest the minimum value of the resistance, which should be compared with the switching action of an unmagnetized switch whose behavior is given by the equation:

$$L(t) = [(1+f)(\Omega t)]\{S(t-t_o)[1-\exp(-t/\tau)] + S(t_o-t)[1-\exp(-t_o/\tau)] \exp[-(t-t_o)/\tau]\} \qquad \text{EQ.(17)}$$

In Eq. (17), time is normalized in units of 1/Ω, in order to allow for comparison with the MSS under similar pulse length and recombination characteristics.

Figure 5A:
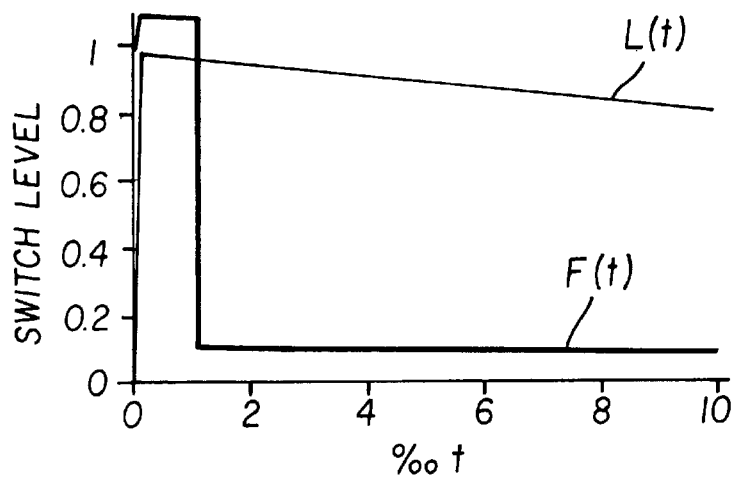
FIGS. 5a–c are plots illustrating F(t) and the corresponding L(t) as a function of time for square laser pulses with normalized pulse lengths $\Omega t_o$=5, 1 and 0.1.
Figure 5B:
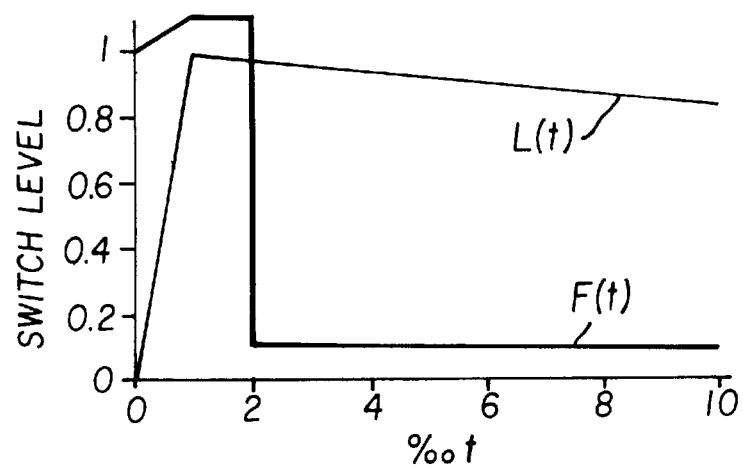
Figure 5C:
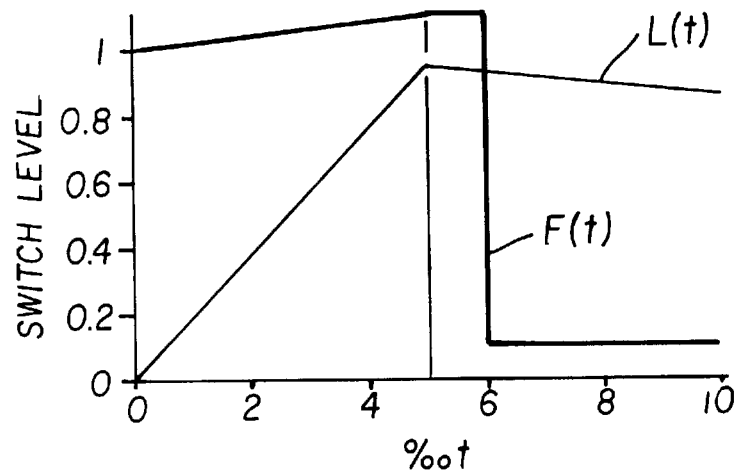
Figure 6A:
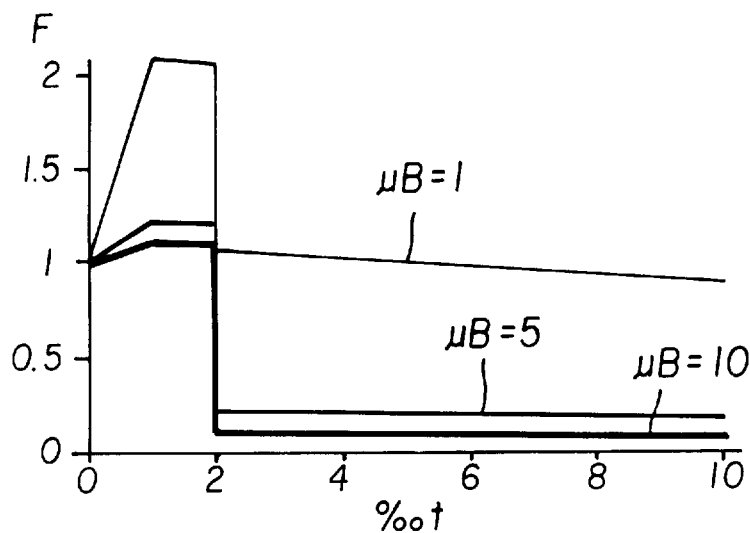
FIGS. 6a and 6b show the behavior of F(t) for different values of b for $\Omega t_o$=1 and 10, f=0.1 and $\Omega t$=50.
Figure 6B:
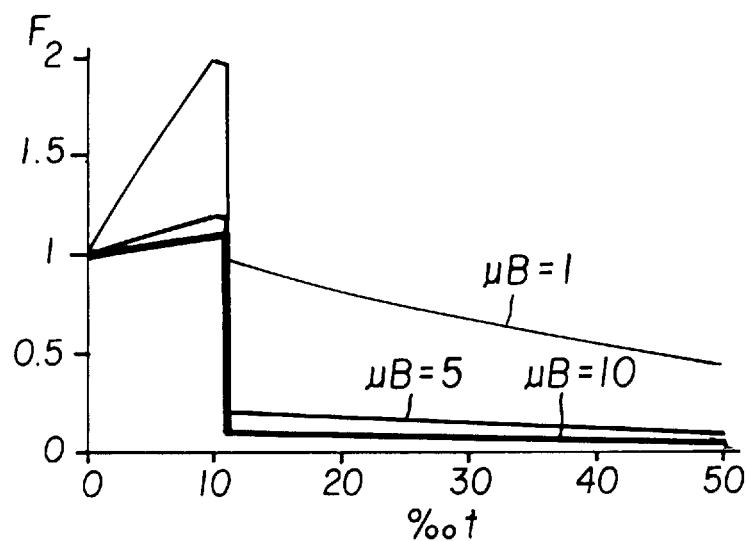

FIG. 5 shows F(t) and the corresponding L(t) as a function of time for square laser pulses with normalized pulse lengths $\Omega t_o$=5, 1 and 0.1. The other parameters used in the calculations were b=10, f=0.1 and $\Omega\tau$=50. It is clear that in all cases the MSS switching time is of the order of $1/\Omega$ which is much faster than for the conventional unmagnetized switches. Notice that for the $\Omega t_o$=0.1 case the "off" state starts at $\Omega t_o$=1 rather than 0.1 which is the duration of the pulse. This value gives the minimum response time. The level of the conductivity jump is controlled by the value of b. This is seen in FIG. 6 which shows the behavior of F(t) for different values of b for $\Omega t_o$=1 and 10, f=0.1 and $\Omega\tau$=50. The results are indicative of the switching properties of the MSS in the entire parameter range.

The performance of the MSS as reflected in the temporal behavior of the MSS resistance for parameters typical of a GaAs MSS. From Eq. (16) and in practical units the resistance in Ohms as a function of time is given by:

$$R(t)=0.6\ (l/0.1\ \text{cm})^2(1/\mu)(10^{13}/N)(\Omega t_o)b[1/F(t)]\text{ohm} \quad \text{EQ.(17)}$$

Figure 7A:
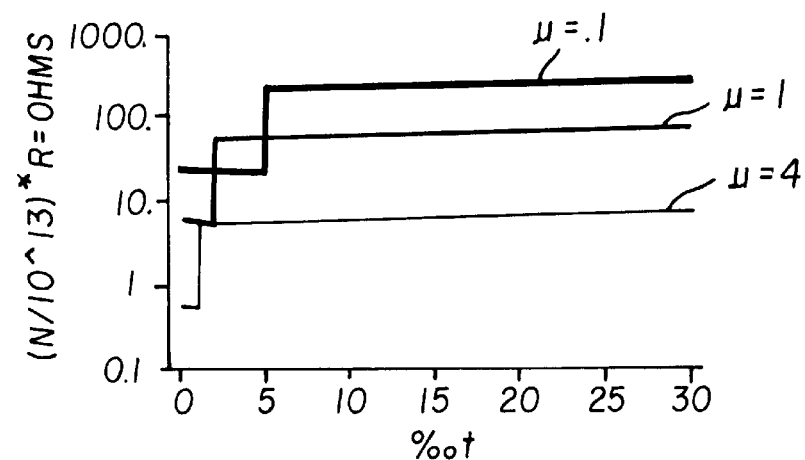
FIG. 7a and 7b show resistance as a function of pulse length for parameters typical of GaAs.
Figure 7B:
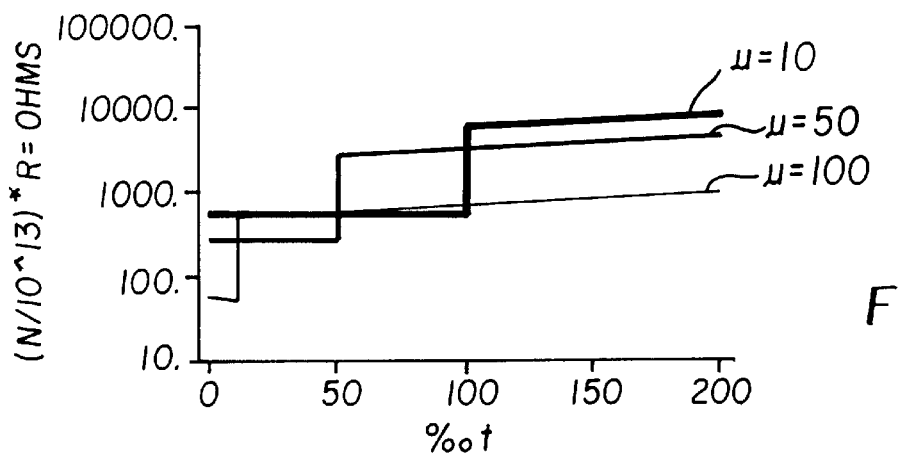
Figure 8:
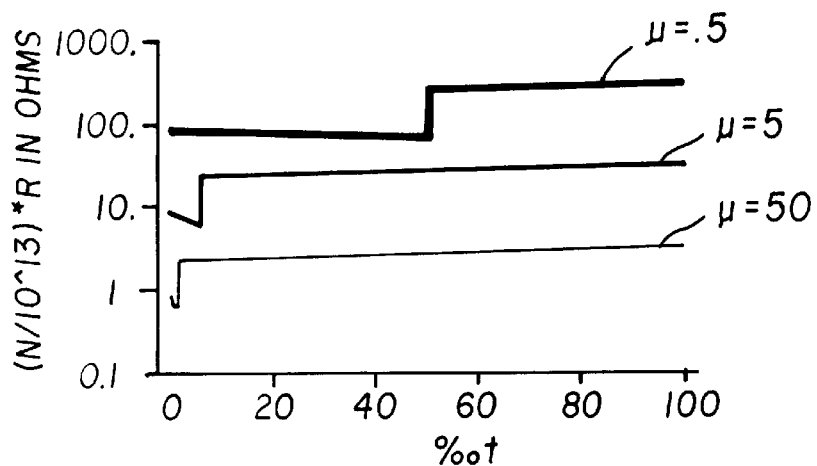
FIG. 8 shows resistance as a function of pulse length with a magnetic field of three Tesla and cyclotron time 0.1 psec at pulse lengths of 0.5, 5 and 50.
Figure 9:
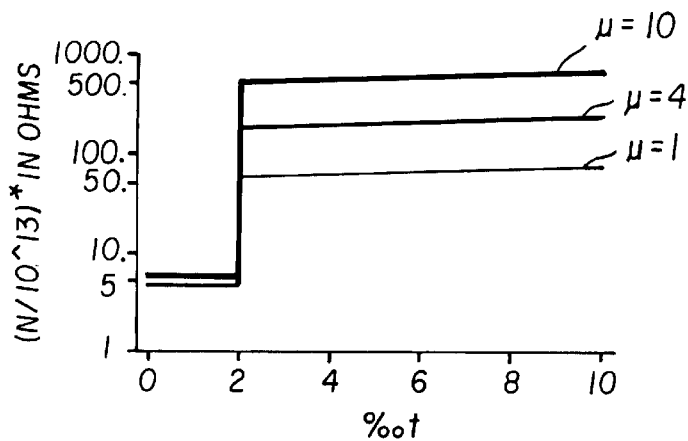
FIG. 9 shows results for the case where the magnetic field is constant at 10 Tesla and mobility is varied from $\mu$=1–10 by lowering the temperature of the switch.
Figure 10:
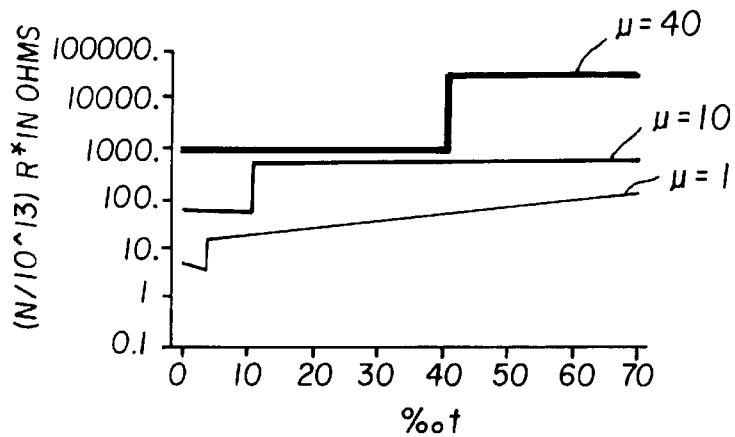
FIG. 10 shows the temporal response of the resistance for constant pulse length $t_o$, $\mu$=1 and a magnetic field varying from 3 to 40 Tesla.

In Eq. (17), $\mu$ is in MKS units, N is the number of photons absorbed by the semiconductor during the pulse, and the length is in units of 0.1 cm. The resistance is independent of the width if the energy deposited in the photoconductive volume by the pulse is constant. Since F(t) is independent of N and l but depends on $\mu$,b and $\Omega t_o$, the resistance scales as $1/N$ and $l^2$. FIG. 7 shows the resistance as a function pulse length for parameters typical of GaAs. The value of $\mu$=1, while b=10 corresponding to a mnagnetic field of 10 Tesla. The cyclotron time corresponds to 0.04 psecs. The figure plots the value of the resistance in ohms multiplied by $(N/10^{13})$ for pulse lengths $\Omega t_o$=0.1, 1, 4, 10 and 100. FIG. 8 is similar to FIG. 7 except that the magnetic field was taken as 3 Tesla giving b=3 and cyclotron time 0.1 psec. Pulse lengths of 0.5, 5 and 50 were examined. FIG. 9 shows results for the case that the magnetic field was constant at 10 Tesla, but the mobility varied from $\mu$=1–10 by lowering the temperature of the switch. It demonstrates that the resistance jump scales linearly with $\mu$. Similar scaling exists for constant $\mu$ but increasing B. Finally, FIG. 10 shows the temporal response of the resistance for constant pulse length $t_o$, $\mu$=1 and magnetic field varies varying from 3 to 40 Tesla. The previous analysis applies equally well to other photoconducting semiconductors such as Silicon, Indium Antimonide, Germanium etc, with the appropriate magnetic field value that satisfies the $\mu$B>1 condition.

Figure 11:
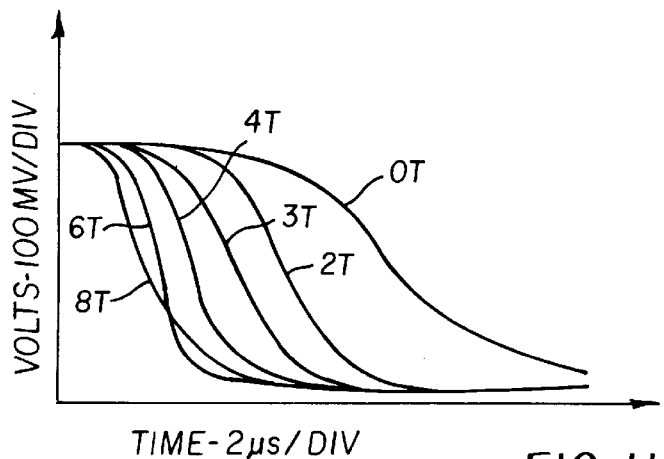
FIG. 11 is a graph showing experimental results of the application of magnetic fields of different strengths to a silicon chip.

FIG. 11 illustrates actual experimental results obtained from applying magnetic fields of varied strengths (0–8 Tesla) to a 3 mm wide and 1 mm thick silicon chip, to which a 200 microsecond 80 volt pulse is applied.

The present invention provides for a photoconducting switch whose transition to the "off" state is controlled by the value of the ambient magnetic field rather than the recombination or the carrier "sweep out" time. By using magnetic fields in excess of 1 Tesla this transition can occur within subpicosecond times following the end of the illumination of the switch. More specifically, a magnetic field B is applied in a direction perpendicular to an applied voltage, whose magnitude in Tesla satisfies the condition:

$$\mu B>1$$

which results in transitioning to the "off" state on a time equal to $1/\Omega$, following the termination of an optical pulse applied to the switch. As a result, the magnetic field provides external means for controlling the duration of the effective current or voltage pulses produced by the switching action. The temporal response of the switch is therefore controlled mainly by the optical pulse, the value of B and the value of $\mu$B, and not on intrinsic properties of the photoconductor, such as its recombination time. Furthermore, the value of the $\mu$B provides control of the jump of the resistance between the "on" and the "off" state. The insertion of the magnetic field reduces the dissipation rate by a factor of $\mu$B over the unmagnetized switch.

The invention has been described with reference to certain preferred embodiments thereof. It will be understood, however, that modifications and variations are possible within the scope of the appended claims. For example, the magnetic field can be applied by any desirable means, including a coil, and is not limited to the use of permanent magnets as shown.

Industrial Utility

The invention has application in the development of novel devices that produce microwaves and mm waves, as well as in impulse radars, fast detection devices, generation of subpicosecond pulses for medical and other diagnostic applications, and computer gating circuits.

What is claimed is:

1. A photoconductive semiconductor device comprising:

a block of semiconducting material;

contact means for connecting the block semiconducting material to a voltage source and a load; and means for applying a constant magnetic field B to the block of semiconducting material, wherein the magnitude of the magnetic field in Tesla and mobility ($\mu$) in meters squared per second satisfy the condition $\mu$B>1;

wherein said photoconductive semiconductor device switches between and OFF state, during which power is not supplied from the voltage source to the load, and an ON state, during which power is supplied from the voltage source to the load, when an optical pulse is applied to the block of semiconductor material.

2. A photoconductive semiconductor device as claimed in claim 1, wherein a switching time of the device is less than one picosecond.

3. A photoconductive semiconductor device as claimed in claim 1, wherein the magnetic field B is applied to the block of semiconducting material in a direction perpendicular to an electrical field applied to the block semiconducting material by the voltage source.

4. A photoconductive semiconductor device as claimed in claim 1, further comprising means for applying an optical pulse to the block of semiconducting material.

5. A photoconductive semiconductor device as claimed in claim 1, wherein the block of semiconducting material consists of a single conductivity type.

6. A photoconductive semiconductor device as claimed in claim 1, wherein a switching time of the device is less than one nanosecond.

* * * * *